United States Patent [19]

Goronkin et al.

[11] Patent Number: 5,142,341
[45] Date of Patent: Aug. 25, 1992

[54] ENHANCED CONDUCTIVITY QUANTUM WELL STRUCTURE HAVING RESONANT INTERFACE PHONON INDUCED CHARGE COUPLING

[75] Inventors: Herbert Goronkin, Tempe; X. Theodore Zhu, Chandler, both of Ariz.

[73] Assignee: Motorola, Inc., Schaumburg, Ill.

[21] Appl. No.: 681,261

[22] Filed: Apr. 8, 1991

[51] Int. Cl.⁵ ............... H01L 29/161; H01L 29/205; H01L 29/225; H01L 27/12
[52] U.S. Cl. ............................ 357/16; 357/4; 357/22; 357/23.4
[58] Field of Search ............... 357/4, 22, 23.4, 16, 357/17

[56] References Cited

U.S. PATENT DOCUMENTS

| Re. 33,671 | 8/1991 | Dingle et al. | 357/17 |
|---|---|---|---|
| 4,163,237 | 7/1979 | Dingle et al. | 357/22 A |
| 4,839,702 | 7/1989 | Grinberg et al. | 357/16 |
| 5,012,302 | 4/1991 | Goronkin | 357/4 |
| 5,049,951 | 9/1991 | Goronkin et al. | 357/4 |
| 5,061,970 | 10/1991 | Goronkin et al. | 357/4 |

OTHER PUBLICATIONS

Kash "Picosecond Studies of Hot Phonon Generation in III-V semiconductors" *SPIE* vol. 942, (1988). pp. 138-144.

Ridley "Electron Scattering by Confined LO Polar Phonons in a Quantum Well" *Physical Review B* vol. 39, No. 8 (Mar. 15, 1989) pp. 5282-5286.

Primary Examiner—Andrew J. James
Assistant Examiner—Daniel N. Russell
Attorney, Agent, or Firm—Stuart T. Langley

[57] ABSTRACT

An enhanced conductivity structure comprising first and second coupled quantum well channel layers spaced from each other by a barrier layer of predetermined thickness is provided. The barrier layer and other supporting layers comprise a first material type, while the first and second quantum wells comprise a second material type having a narrower bandgap than the first material type. Each of the quantum wells is thin to confine current flow to the plane of the quantum wells. First and second spacer layers of the first material type are formed adjacent to each of the quantum wells, and planar doping layers are provided on each of the spacer layers. First and second buffer layers of the first material type are formed adjacent to each of the spacer layers.

6 Claims, 2 Drawing Sheets

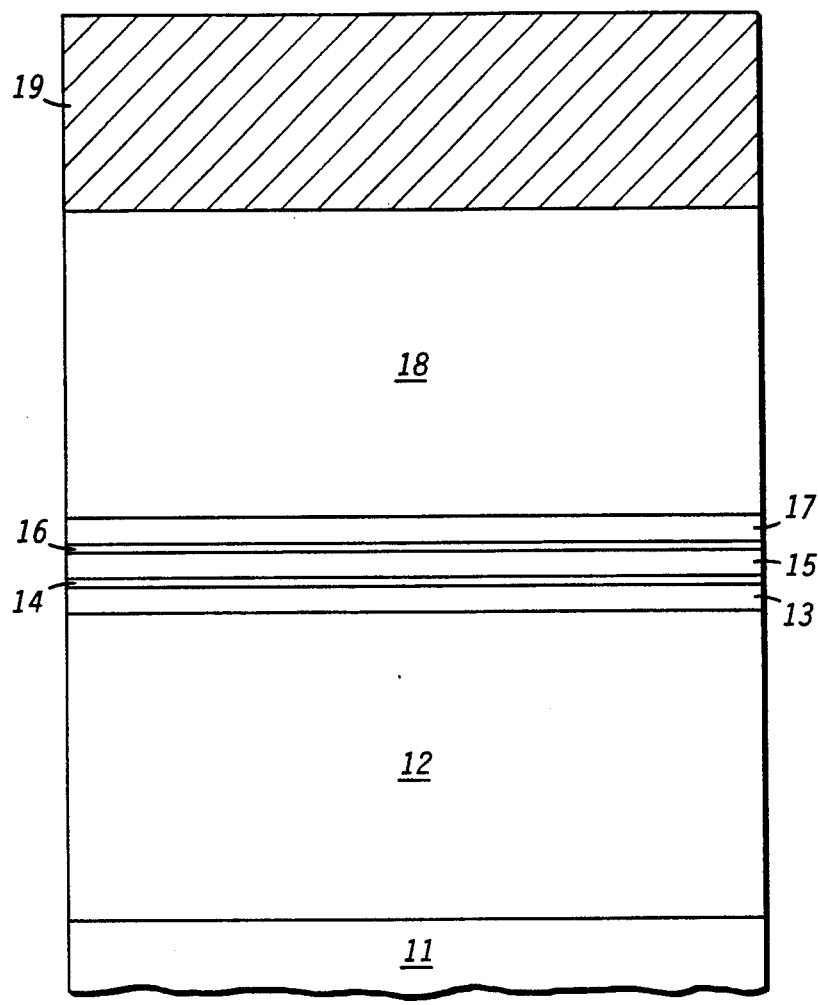
FIG. 1
FIG. 3
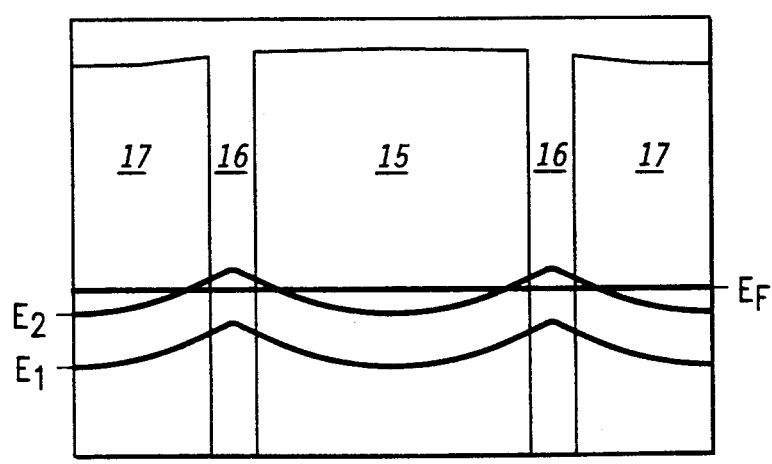

ENHANCED CONDUCTIVITY QUANTUM WELL STRUCTURE HAVING RESONANT INTERFACE PHONON INDUCED CHARGE COUPLING

BACKGROUND OF THE INVENTION

This invention relates, in general, to solid state conductors, and more particularly, to a resonant high conductivity structure made from semiconductor materials.

Superconductivity results in a crystal lattice when electrons which are normally spread throughout energy levels within plus or minus $k_B TC$ of a Fermi energy ($E_F$) gather in a single energy state which is approximately $k_B T_C$ below $E_F$, where $T_c$ is the critical temperature at which superconductivity occurs and $k_B$ is the Boltzmann constant. Electrons can only gather in the single energy state by coupling or pairing into what is known as "Cooper pairs". A Cooper pair comprises two electrons with equal and opposite momentum and spin which results in a tighter electron packing density than is possible under normal conditions. Because of the energy gap at the Fermi surface, it takes a finite energy approximately $k_B T_C$, to break a Cooper pair. Consequently, at temperatures $T < T_C$, the paired electrons carry charge in their energy level with zero resistance.

According to BCS theory:

$$T_C = 1.13 \Theta_D e^{-1/N(\epsilon_F)V}$$

where $\Theta_D$ is the Debye energy of the material, $N(\epsilon_F)$ is the density of states at the Fermi surface, and V is the interaction strength of the acoustic phonon induced attraction between the two Cooper pairing electrons. Generally speaking, the interactions are weak resulting in low critical temperatures around 1 Kelvin.

The BCS critical temperature formula implies several approaches to improving critical temperature. Increasing frequency of the coupling mode theoretically raises $T_c$. Besides the acoustic phonons in conventional superconductors, tremendous efforts have been made in searching for new mechanisms with higher energy Bosons, such as optical phonon, plasmon, excition, polaron, magnon, and the like. Another method of raising $T_c$ is by increasing density of states $N(\epsilon_F)$. For bulk materials, however, it is very difficult to increase density of states since $N(\epsilon_F)$ is approximately equal to $$\sqrt[3]{n}.$$

where n is the electron concentration. In other words, electrons are used inefficiently in bulk material superconductors because only electrons on the Fermi surface are involved in enhanced conductivity.

Another theoretical method of increasing $T_c$ involves increasing interaction strength via a Boson mode. It should be noted that increasing interaction strength is generally detrimental to increasing frequency of the coupling mode, mentioned above. A high frequency Boson mode results in short retardation time and consequently weaker induced attraction between the two Cooper pairing electrons.

Accordingly, a key feature of superconducting materials is an ability to allow electrons to exist as paired electrons rather than Fermions, which are responsible for normal resistive charge conduction. Much work has been done recently to develop materials in which paired electrons can exist at high temperatures. The present invention deals with a method of promoting the formation of paired electrons at temperatures where such pairing would not naturally occur.

Electrons in a crystal lattice have a characteristic coherence length which is determined by electronic and crystallographic properties of the crystal lattice. External forces such as heat and electromagnetic fields affect this electron coherence length. Electrons in normal conduction states repel each other, and will not come close enough to form pairs. Electrons in superconductors, it is believed, interact with lattice vibrations (phonons) to form pairs. Paired electrons are closer to each other than the electron coherence length. In naturally occurring superconductors electron-phonon interactions result in superconductivity at low temperature, where the electron coherence length is sufficiently long.

The present invention uses semiconductor materials to provide a quantum well structure which is adapted to promote electron-phonon interaction, and in particular, to promote electron-phonon interactions which result in formation of paired electrons in materials and at temperatures where paired electrons do not normally exist.

A similar enhanced conductivity material is disclosed in U.S. Pat. Nos. 5,012,302 and 5,016,970 issued to Herbert Goronkin on Apr. 30, 1991 and Oct. 29, 1991 respectively and assigned to the same assignee as the present invention. U.S. Pat. No. 5,012,302 is incorporated herein by reference.

SUMMARY OF THE INVENTION

The advantages of the present invention are achieved by an enhanced conductivity structure comprising first and second coupled quantum well channel layers spaced from each other by a barrier layer of predetermined thickness. The barrier layer and other supporting layers comprise a first material type, while the first and second quantum wells comprise a second material type having a narrower bandgap than the first material type. Each of the quantum wells is thin to confine current flow to the plane of the quantum wells. First and second spacer layers of the first material type are formed adjacent to each of the quantum wells, and planar doping layers are provided on each of the spacer layers. First and second buffer layers of the first material type are formed adjacent to each of the spacer layers.

BRIEF DESCRIPTION OF THE DRAWINGS

FIG. 1 illustrates an enlarged cross section view of an enhanced conductivity structure in accordance with the present invention;

FIG. 3 illustrates an enlarged portion of the conduction band diagram shown in FIG. 2.

DETAILED DESCRIPTION OF THE DRAWINGS

Figure 2:
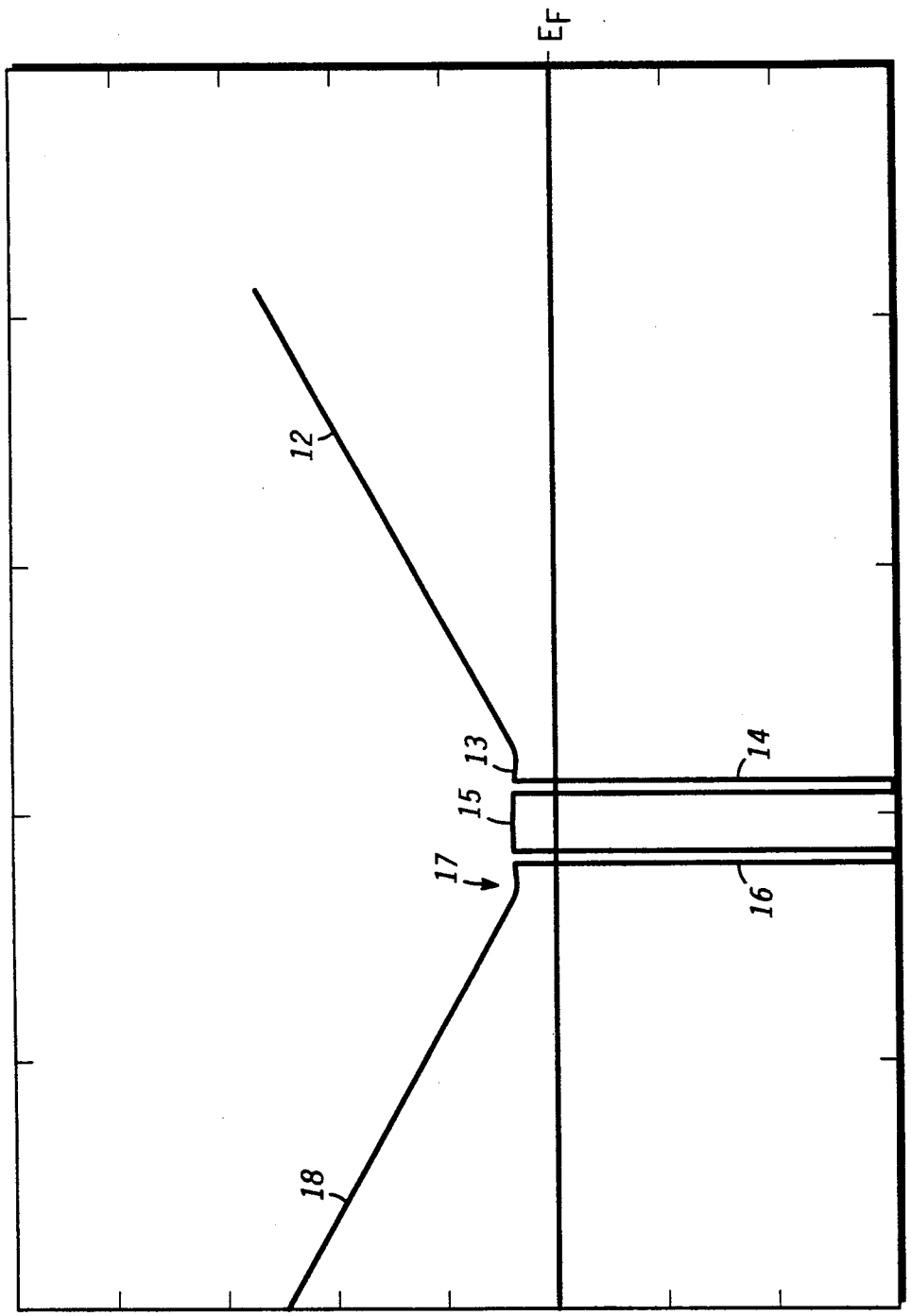
FIG. 2 illustrates a conduction band diagram of quantum well characteristics of the present invention.

The present invention enhances conductivity of superlattice layers by improving performance with respect to all three approaches implied by BCS theory and discussed above. Coupled electrons are believed to carry charge in normally resistive or insulating materials with zero energy loss due to scattering of the electrons. Paired electrons can be formed by electron interactions with a crystal lattice, also known as electron-phonon interactions. In most naturally occurring superconductive materials, characteristic energy levels and phonon spectra are such that electron pairing and thus superconductivity can occur. The present invention involves creating a synthetic material in which optical interface phonons resonate with two lowest sub-band energy levels of electrons confined in two very narrow quantum wells. Distance between these two quantum wells is determined by the resonating condition.

FIG. 1 illustrates an enlarged cross section view of an enhanced conductivity structure in accordance with the present invention. Substrate 11 comprises a single crystal semi-insulating material providing mechanical support for formation of the enhanced conductivity structure. The layered structure shown in FIG. 1 may be epitaxially grown on substrate 11 by processes such as metal organic chemical vapor deposition (MOCVD), molecular beam epitaxy (MBE), atomic layer epitaxy (ALE) or the like. A wide variety of materials including silicon, germanium as well as III-V and II-VI compound semiconductors may be used to form buffer layers 12 and 18, spacer layers 13 and 17, barrier layer 15, and quantum well channel layers 14 and 16. It is important, however, that quantum well layers 14 and 16 have a narrower bandgap than layers adjacent to them. Choice of materials will be determined by desired relationships between quantum energy levels and phonon energy spectra of the materials.

A first buffer layer 12 comprises a single crystal wide bandgap material such as aluminum arsenide (AlAs). The first buffer layer 12 serves both as a wide band gap barrier to electrons and as a mechanical buffer to prevent crystal defects in substrate 11 from affecting performance in upper layers. In a preferred embodiment, first buffer layer 12 is approximately 450 angstroms thick. Planar doping layer 21 is formed covering first buffer layer 12 to provide excess charge carriers which conduct current in the structure. Planar doping layer 21 is also known as a delta doping layer, a charge supply layer, or modulation doping layer. Techniques for forming planar doping layer 21 are well known in the semiconductor industry, and are widely used in common devices such as heterojunction field effect transistors. In a preferred embodiment, planar doping layer 21 provides $1.7 \times 10^{12}$ electrons/cm$^2$.

Planar doping layer 21 and the first buffer layer 12 are covered by a first spacer layer 13. The first spacer layer comprises a wide band gap material, preferably the same material used in first buffer layer 12. Excess charge carriers from planar doping layer 21 must tunnel through the first spacer layer 13. In a preferred embodiment the first spacer layer 13 comprises 50 angstroms of single crystal AlAs.

A first quantum well channel 14 is formed on the first spacer layer 12. Notably, first quantum well channel 14 is quite thin, preferably comprising one or two monolayers (approximately seven angstroms) of narrow bandgap material. First quantum well channel 14 is thin to confine current flow to the plane of quantum well layer 14. Coupling between an interface phonon and an electron in a quantum well of width W is inversely proportional to W. Therefore, it is advantageous to use very narrow quantum wells to force the confined electrons to interact with interface phonons. Excess charge carriers from planar doping layer 21 tunnel through the first spacer layer 13 and fall into the first quantum well channel 14. Charge carriers are confined to the first quantum well channel 14 by surrounding wider bandgap materials. In a preferred embodiment the first quantum well channel 14 comprises two monolayers of indium arsenide (InAs).

The first quantum well channel 14 is covered by barrier 5 of a wide bandgap material, preferably a similar material to that used for buffer 12 and spacer 13. Barrier 15 is of a predetermined thickness designed to determine quantum energy levels in the structure, as described in more detail hereinafter. Because barrier 15 comprises a wider bandgap material than the first quantum well channel 14, it serves to confine electrons in the first quantum well channel 14.

A second quantum well channel 16 is epitaxially grown on barrier 15 and therefore spaced from the first quantum well channel 14 by the predetermined thickness of barrier 15. The second quantum well channel 16 comprises a narrow bandgap material similar to first quantum well channel 14, such as InAs. Second quantum well channel 15 also is about two monolayers thick.

Second quantum well channel 16 is covered by epitaxially grown layers including a second spacer layer 17 and a second buffer 18, comprising a wide bandgap material similar to the first buffer 12 and the first spacer 13. In a preferred embodiment, the second spacer 17 comprises approximately forty angstroms of AlAs and the second buffer comprises approximately four hundred angstroms of AlAs. A second planar doping layer 22 is formed at an interface of the second spacer 17 and the second buffer 18. In a preferred embodiment the second planar doping layer 22 provides $1.53 \times 10^{12}$ electrons/cm$^2$.

An optional gate electrode 19 is formed on top of the second buffer 18 making a rectifying contact with the wide bandgap material of the second buffer 18. It is believed that gate electrode 19 may be quite useful for applying an external bias to the enhanced conductivity structure, so that position of two lowest sub-bands of the structure with respect to the Fermi surface can be adjusted. It should be noted that charge carrying electrodes (not shown) are necessary to make contact to current flowing in the plane of quantum well channels 14 and 16. These charge carrying electrodes may take a wide variety of shapes, positions and material compositions depending on the particular application of the enhanced conductivity structure.

Interface optical phonons are generated by interaction between quantum well channels 14 and 16 with spacer layers 13 and 17 and barrier 15. The phonons have a characteristic energy and wavelength determined by the particular materials used. It has been found that a useful phonon energy is generated when InAs is used for quantum well channels 14 and 16 and AlAs is used for spacer layers 13 and 17 and barrier 15.

In operation, current flows through the superlattice structure shown in FIG. 1 parallel to the plane of the layers. Also, current flows primarily in quantum well channels 14 and 16 as opposed to layers 13, 15, and 17. Although the invention has been described in terms of specific material types for each layer, it should be understood that it is the relationship between band gap energy and phonon spectra of each of the layers that is important. It will be apparent to those of skill in the art that numerous combinations of materials can be used to produce quantum wells, barrier layers, and modulation doping. Also, although the present invention is described in terms of electron phonon coupling to enhance conductivity, it should be understood that hole coupling will also result in enhanced conductivity. The principles and elements of the present invention are equally applicable to hole coupling when material and doping changes are made.

FIG. 2 illustrates a simplified conduction band diagram of the enhanced conductivity structure shown in FIG. 1. The conduction band is labeled at locations corresponding to layers and regions shown in FIG. 1 using the same designation as in FIG. 1. Superimposed on the conduction band diagram is Fermi energy level, $E_F$, and a first and a second quantum energy levels $E_1$ and $E_2$, and corresponding electron distributions, i.e., electron wave functions squared. Conduction band energy gradually changes in buffer layers 12 and 18 due to band bending effects of quantum well channels 14 and 16 and excess charge carriers provided by planar doping layers 21 and 22. Planar doping layers 21 and 22 do not affect the conduction band energy directly, and so are not visible in the conduction band diagram.

Conduction band energy is relatively flat in spacer layers 13 and 17 and barrier 15. Narrow bandgap quantum well channels 14 and 16 appear as sharp, thin quantum wells which trap electrons in the conduction band between the insurmountable barrier created by surrounding wide bandgap materials. Relationship of $E_F$, $E_1$, and $E_2$ is more clearly seen in the enlarged conduction band diagram shown in FIG. 3. Because of the quantum mechanical nature of the structure in accordance with the present invention, electrons in each of the quantum well channels 14 and 16 are always able to tunnel through barrier 15. Consequently, there is a finite coupling between quantum well channels 14 and 16. These coupled quantum wells produce quantum energy levels $E_1$ and $E_2$ shown in FIG. 3 where energy separation ($\Delta E = E_2 - E_1$) is determined only by the distance between the two narrow wells for a given barrier height. In other words, $\Delta E$ is insensitive to electron density and band bending effects and is an easily controllable parameter.

FIG. 3 illustrates an enlarged view of a portion of the computer modeled conduction band diagram shown in FIG. 2. FIG. 3 illustrates that wavefunctions $E_1$ and $E_2$ are perfectly overlapped. Overlap between $E_1$ and $E_2$ wavefunctions is at a maximum, and because quantum well channels 14 and 16 are very narrow, overlap between a phonon wave fucntion and electron wave function for the system is maximized. It is believed that attractive interaction V, between electrons will be greatly enhanced.

Electrons moving in the enhanced conductivity structure have characteristic quantum energy levels $E_1$ and $E_2$. Electrons travelling in quantum wells 14 and 16 can travel only at discrete energy values $E_1$ and $E_2$. An electron in the ground state can couple strongly to an optical interface phonon and become excited to the next state upon absorption of the phonon. Electrons in this state will tend to not absorb a phonon generator phonon. Instead, electrons in the $E_2$ state are more likely to emit a phonon generator phonon. In this structure, electrons in the ground state absorb phonons while electrons in the first excited state emit phonons.

An important feature of the present invention is that energy separation $\Delta E$ is designed to match the optical interface phonon energy. Because $\Delta E$ is substantially equal to the phonon energy, the electron-phonon interactions caused by the presence of the phonon generator causes electrons to be paired by the absorption-emission process. Coupling between electrons and phonons can be expressed by the equation:

$$V \approx (\Phi_1, \Psi_{phonon}, \Phi_2)^2 \frac{V_{e-p}^2}{(E_2 - E_1)^2 - (\hbar\omega_{phonon})^2}$$

where
V = interaction strength between two Cooper pairing electrons;
$\phi_1 = \Psi_{quantum\ well\ channel\ 14} + \Psi_{quantum\ well\ channel\ 16}$;
$\phi_2 = \Psi_{quantum\ well\ channel\ 14} - \Psi_{quantum\ well\ channel\ 16}$;
$\Psi_{phonon}$ = interface optical phonon wave function; and
$\hbar\omega_{phonon}$ is the energy of a interface optical phonon.

In the present invention, the spacing between the first two energy levels $(E_2 - E_1)$ is equal to the optical phonon energy $(\hbar\omega_{phonon})$. From the electron-phonon coupling equation it can be seen that this relationship between phonon energy and energy levels $E_1$ and $E_2$ results in a resonance condition which maximizes electron-phonon interaction.

InAs which has an optical phonon energy of about 30.5 mev is a good choice for quantum well channels 14 and 16. AlAs which has an optical phonon energy of about 51 meV is a good choice for barrier 15. If barrier 15 is about 47.5 angstroms thick, $\Delta E = 51$ mev, resonating with the AlAs phonons. If barrier 15 is about 50 angstroms thick, $\Delta E = 43$ meV. If barrier 15 is about 55 angstroms thick, $\Delta E = 31$ meV, resonating with the InAs optical phonons. It should be apparent that careful control of thickness of barrier 15 creates a resonant condition maximizing electron-phonon interactions with available phonon energies.

In order to effectively create electron pairs a sufficient number of electrons must be provided to the quantum well. Another important feature of the present invention is that because of the two dimensional nature of the electron system and resonant phonon induced interband scattering, all the electrons in the first, quantum energy level $E_1$ participate in electronphonon interactions, instead of the participation of the limited number of electrons on the Fermi surface in bulk superconductors. In other words, the density of states N which enters into the BCS critical temperature formula, is also increased.

It should be noted that in order to initiate electron pairing, the second quantum energy level $E_2$ must be empty. Only when $E_2$ is empty can an electron in $E_1$ jump to $E_2$ and return to $E_1$ by emitting a phonon. As illustrated in FIG. 3, $E_2$ has a relatively high energy with respect to the Fermi energy level $E_F$ and with respect to $E_1$, and consequently will be devoid of electrons at a relatively high temperature.

Multiple enhanced conductivity channels 14 and 16 may be incorporated into a single superlattice structure. Doping levels and spacer layer thicknesses must be changed to accommodate longer growth time at high growth temperatures. Such process modifications are well known to those of skill in the semiconductor arts.

By now it should be appreciated that a novel synthetic or artificial enhanced conductivity material with critical temperature well above known superconductors. The invention employs a superlattice structure having a pair of thin coupled quantum wells having an quantum energy level separation determined by distance between the two quantum wells. By setting the energy separation substantially equal to an interface phonon energy of materials used in the quantum wells or barrier layers, electron-phonon interaction is maximized. Interactions between electrons and phonons causes a resonant condition in which electrons interact with the quantum well lattice absorbing and emitting phonons which in turn couple the electrons in Cooper pairs. The coupled electrons can travel through the crystal lattice parallel to the phonon generator layer in a highly conducive state.

We claim:

1. An enhanced conductivity structure comprising: a first buffer layer of a first material composition; a first planar doping layer formed in an upper portion of the first buffer layer; a first spacer layer of the first material composition covering the first planar doping layer; a first channel layer of a second material composition covering the first spacer layer, wherein the first material composition has a wider bandgap than the second material composition; a barrier layer of the first material composition covering the first channel layer; a second channel layer of the second material composition formed on the barrier layer, wherein the barrier layer separates the first and second channels; a second spacer layer of the first material composition covering the second channel layer; a second planar doping layer formed in an upper portion of the second spacer layer; and a second buffer layer of the first material composition covering the second planar doping layer, wherein the first and second channels comprise InAs and thickness of the first and second channels is no more than 10 angstroms and thickness of the barrier layer is selected to provide a difference in energy ($\Delta E = E_2 - E_1$) between first and second quantized energy states, wherein $\Delta E$ resonates with energy ($\hbar \omega_{phonon}$) of optical phonons of the structure.

2. The structure of claim 1 wherein the first spacer layer comprises AlAs and the first spacer layer has a thickness of approximately 50 angstroms and the second spacer layer comprises approximately 40 angstroms of AlAs.

3. The structure of claim 2 wherein the first buffer layer comprises AlAs and the first buffer layer has a thickness of approximately 450 angstroms and the second buffer layer comprises AlAs and the second buffer layer has a thickness of approximately 400 angstroms.

4. An enhanced conductivity structure comprising: a first buffer layer of a first material composition; a first planar doping layer formed in an upper portion of the first buffer layer; a first spacer layer of the first material composition covering the first planar doping layer; a first channel layer of a second material composition covering the first spacer layer, wherein the first material composition has a wider bandgap than the second material composition; a barrier layer of the first material composition covering the first channel layer; a second channel layer of the second material composition formed on the barrier layer, wherein the barrier layer separates the first and second channels; a second spacer layer of the first material composition covering the second channel layer; a second planar doping layer formed in an upper portion of the second spacer layer; and a second buffer layer of the first material composition covering the second planar doping layer, wherein the structure has a first quantized energy state ($E_1$), and a second quantized energy state ($E_2$), wherein the barrier layer thickness is determined so that the difference in energy between $E_2$ and $E_1$ is approximately equal to the optical phonon energy of the second material type.

5. An enhanced conductivity quantum well structure comprising: a crystalline substrate; a first single crystal AlAs buffer layer approximately 450 angstroms thick epitaxially grown on the substrate; a first planar doping layer formed on the buffer layer; a first single crystal AlAs spacer layer approximately 50 angstroms thick epitaxially grown covering the planar doping layer and the buffer layer; a first InAs channel approximately two monolayers thick grown on the first spacer layer; a single crystal AlAs barrier layer of a predetermined thickness gown on the first channel layer; a second InAs channel layer approximately two monolayers thick grown on the barrier layer; a second single crystal AlAs spacer layer approximately 40 angstroms thick epitaxially grown on the second channel layer; a second planar doping layer formed on the second spacer layer; and a second epitaxially grown single crystal AlAs buffer layer covering the second planar doping layer and second spacer layer.

6. The quantum well structure of claim 5 wherein the predetermined thickness of the barrier layer is in the range of 40 to 70 angstroms.

* * * * *